United States Patent [19]
Poncelet et al.

[11] Patent Number: 5,807,433
[45] Date of Patent: Sep. 15, 1998

[54] MULTILAYER SYSTEM COMPRISING A DIAMOND LAYER, AN INTERPHASE AND A METALLIC SUBSTRATE, AND A METHOD FOR OBTAINING THESE LAYERS

[75] Inventors: Olivier Jean Christian Poncelet; Jean-Jacques Edgar Garenne, both of Chalon Sur Saone Cedex, France

[73] Assignee: Eastman Kodak Company, Rochester, N.Y.

[21] Appl. No.: 597,306

[22] Filed: Feb. 6, 1996

[30] Foreign Application Priority Data

Mar. 3, 1995 [FR] France .................................. 95 02728

[51] Int. Cl.$^6$ .................................................. C30B 29/04
[52] U.S. Cl. .............................. 117/89; 117/95; 117/101; 117/929; 423/446
[58] Field of Search ................................ 117/929, 89, 95, 117/14; 423/446

[56] References Cited

U.S. PATENT DOCUMENTS

| | | | |
|---|---|---|---|
| 4,740,263 | 4/1988 | Imai et al. | 156/613 |
| 5,009,966 | 4/1991 | Garg et al. | 428/627 |
| 5,399,247 | 3/1995 | Carey et al. | 204/131 |

FOREIGN PATENT DOCUMENTS

| | | | |
|---|---|---|---|
| 166 708 | 1/1986 | European Pat. Off. | C23C 16/26 |
| 2 275 567 | 7/1977 | France . | |
| 60231494 | 4/1984 | Japan . | |

OTHER PUBLICATIONS

Ping et al., "Studies of Structure of Transition Layers Between Diamond Film, . . . ", Int. Conf. Appl. Diamond Films, Relat. Mat. 2nd (1993) abs only.

Vyshinskaya et al., Inorganic Materials, vol. 12, No. 12, Dec. 1976, US pp. 1771–1772, "Deposition of Titanium Carbide From the Gas Phase During Pyrolysis of Cyclopentadienyl Compounds of Titanium".

*Primary Examiner*—Robert Kunemund
*Attorney, Agent, or Firm*—J. Jeffrey Hawley

[57] ABSTRACT

The present invention concerns a novel multilayer system comprising a diamond layer, and the method of manufacturing this multilayer system.

The invention concerns a multilayer system comprising a metallic substrate, an interphase and a diamond layer, the interphase being composed of the product of thermal decomposition of at least one metallocene compound.

This multilayer system, capable of being used as an electrode, has improved adhesion between the substrate and the diamond layer.

17 Claims, 4 Drawing Sheets

MULTILAYER SYSTEM COMPRISING A DIAMOND LAYER, AN INTERPHASE AND A METALLIC SUBSTRATE, AND A METHOD FOR OBTAINING THESE LAYERS

The present invention concerns a novel multilayer system comprising a diamond layer, an interphase and a metallic substrate, and the method of manufacturing this multilayer system.

BACKGROUND

For many years, the synthesis of diamond from a carbon source such as graphite subjected to a pressure greater than 50 kbar and a temperature greater than 1200° C. in the presence of a metallic catalyst such as nickel, cobalt or iron has been known. However, diamond produced by this technique always contains traces of metallic catalyst.

It is also possible to synthesize diamond by the chemical vapour deposition (CVD) technique. This technique consists in applying, to a gaseous mixture composed of hydrogen and a carbon source such as a hydrocarbon, sufficient energy to dissociate the hydrogen into atomic hydrogen, the carbon source into active carbon ions, carbon atoms or free CH radicals, and depositing these different species on a substrate where the diamond is formed.

The dissociation of the gas may be effected by various techniques.

By way of example, the so-called "Plasma enhanced CVD" (PECVD) technique may be cited, according to which use is made of a reactor composed principally of a chamber capable of being hermetically sealed and within which a partial vacuum may be established using pumps. The part or parts which are to be coated are placed on a metallic substrate (substrate-carrier cathode) connected to a current generator, if necessary through a sealed insulator. The carbon containing gas, in particular containing one or more hydrocarbons, usually methane, acetylene, propane or butane, to which are added hydrogen and optionally rare gases, in particular argon, may be introduced into the reactor by means of metering valves while the pumps are operating. Under required conditions of pressure and electrical power, the gas is excited physically and chemically, and ionised so that the atoms lose electrons, changing into positive particles, thus forming a plasma which causes "cracking" of the gaseous mixture, and the products of the cracking are deposited on the component to be coated. The volume of plasma is surrounded by an area called the "sheath" across which the ions are accelerated (plasma physics). Deposition by this technique has been the subject of publications (see for example, Klages, *Appl. Phys.* A56 (1993) 513–526).

Another CVD deposition technique consists of a so-called hot filament CVD (HFCVD) deposition technique (refer for example to Klages, *Appl. Phys.* A56 (1993) 513–526). Thus, for diamond layer deposition, a device comprising typically a water-cooled stainless steel vacuum chamber is used, this vacuum chamber being evacuated by means of a two-stage pump. The part to be covered is placed on a substrate carrier, in the vicinity of which a filament brought to a temperature of around 2000° C. is disposed, and the function of which is to split the gas molecules into elementary molecules which can then be deposited. By way of example, the filament may be of tungsten, tantalum or rhenium.

According to another technique referred to as the "electron assisted CVD technique" (EACVD), the upper part of a substrate is maintained at a temperature of at least 400° C. in an atmosphere of a gaseous mixture composed of hydrogen and hydrocarbon under reduced pressure conditions. The upper surface of the substrate is subjected to a bombardment of electrons which enables the formation of diamond crystal seeds to be brought about on the said surface. These seeds will grow, so as to form a thin diamond layer. Such a technique is described in detail in U.S. Pat. No. 4,740,263.

The scope of application of the present invention also encompasses all the well-known vacuum deposition devices. These devices have been the subject of many publications in patent literature and consequently do not require any particular expansion.

In many publications, diamond layers have been deposited on a metallic substrate, in particular a titanium or titanium alloy substrate. These diamond layers have very many applications because of their great rigidity, their hardness, their thermal conductivity and their resistance to corrosion.

However, it is very difficult to obtain diamond layers on metallic substrates. For example, it is very difficult to make a diamond layer adhere to a titanium or titanium alloy substrate. This is because the high reactivity of the titanium or titanium alloys conflicts with the high chemical stability of the diamond.

In many publications, means intended to increase the adhesion between the metallic substrate and the diamond are described. For example, in the article by M D Drory and J W Hutchinson, an attempt was made to make the surface of the diamond irregular by mechanical treatments such as abrasion. The major disadvantage of this technique is the non-uniformity of the surfaces of the final system.

Attempts have also been made to modify the adhesion between the metallic substrate and the diamond by adding an intermediate layer.

For example, in French patent 2 275 567, an intermediate layer, composed of a solid solution comprising the constituents of the metallic substrate and the diamond, was introduced between the metallic substrate and the diamond layer.

In U.S. Pat. No. 5,009,966, an attempt was made to remedy the problem of adhesion by introducing, between the titanium substrate and a hard ceramic, metal or diamond layer, deposited by CVD, an interlayer of a non-reactive noble metal obtained by electrolytic deposition. Before the deposition by CVD of the hard layer and after electrolytic deposition of the interlayer, the substrate-interlayer assembly is subjected to heat treatment between 200° and 300° C. in the presence of an inert gas.

In Japanese patent application JP-60231494, diamond powders were obtained by plasma assisted CVD, the plasma being composed of hydrogen, methane and metallocene. This method enables a diamond powder having a particle size between $10^{-2}$ μm and $10^{-1}$ μm used as an abrasive powder to be obtained.

SUMMARY OF INVENTION

In this method, the metallocene is used to improve the abrasive quality of the diamond powders. The adhesion problems encountered when manufacturing diamond layers on a metallic substrate do not arise when such powders are made.

It is therefore of particular interest to provide a novel multilayer system comprising a metallic substrate, an interphase and a diamond layer, which exhibits strong adhesion between the metallic substrate and the diamond layer, and a method of manufacture of such a system which is easy to implement.

This object is achieved according to the invention by means of a multilayer system comprising a metallic substrate, an interphase and a diamond layer, the interphase being composed of the product of thermal decomposition of at least one metallocene compound of formula $R_nMX_m$ in which X is a halogen atom, M is a metal selected from titanium, cobalt, nickel and iron, R is a cyclopentadienyl radical which may or may not be substituted, and n and m are such that n is equal to at least 1 and the sum n+m is equal to the valency of the metal.

The cyclopentadienyl radical or radicals may, for example, be substituted in one or more positions by a linear or branched alkyl group of 1 to 5 carbon atoms.

According to the invention, the metallocene is preferably a titanocene of formula $(\eta^5-C_5H_5)_nTiX_m$ in which X is Cl or Br, n is equal to at least 1, preferably 2, and the sum of n+m is equal to 4. According to a preferred embodiment, the titanocene is $(\eta^5-C_5H_5)_2TiCl_2$.

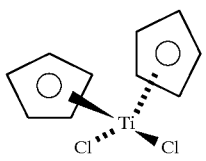

DETAILED DESCRIPTION

Figure 1:
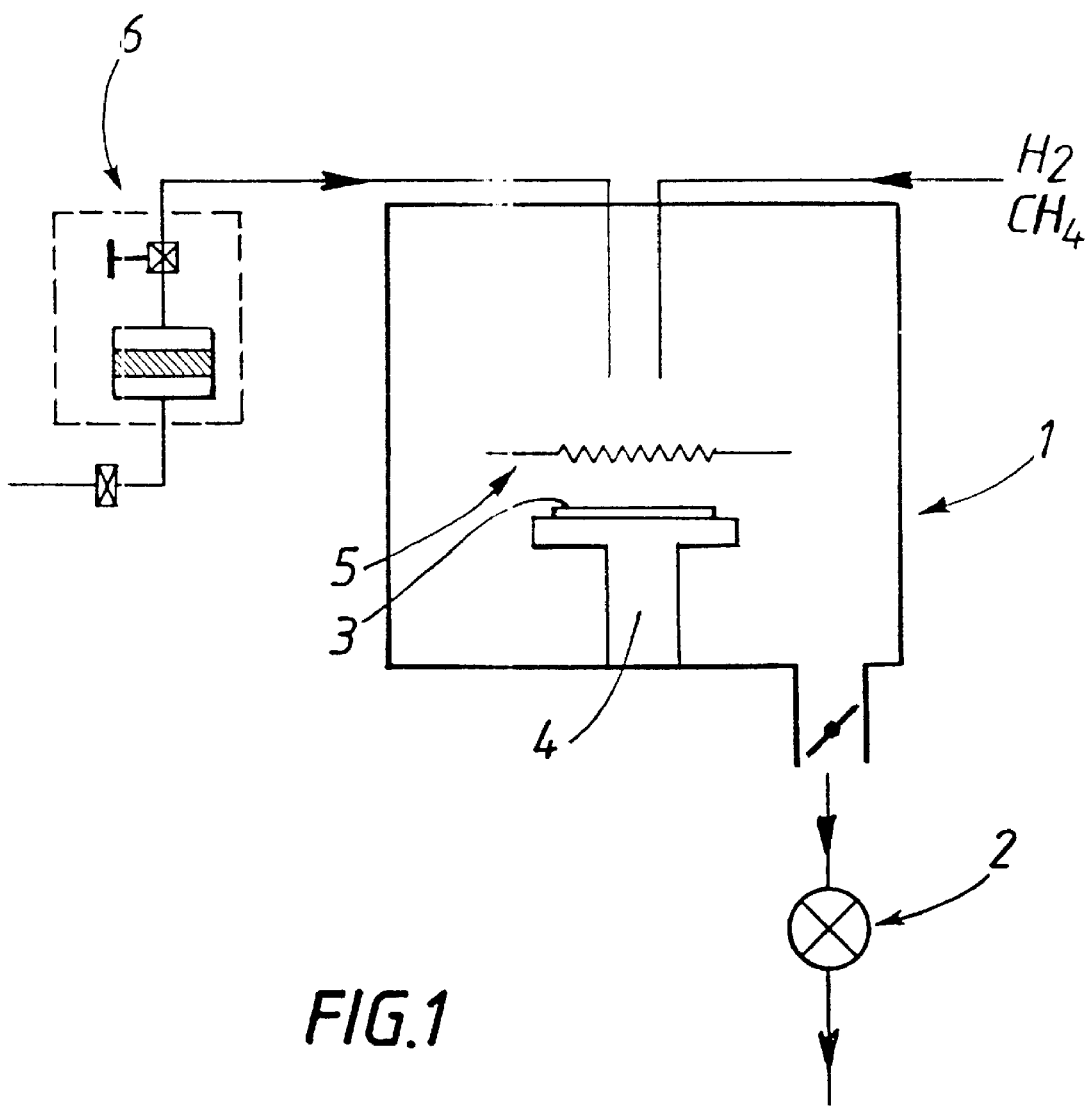
FIG. 1 depicts schematically a hot filament CVD (HFCVD) device which comprises a reaction chamber (1) equipped with several means allowing the introduction of reagents. Inside the reaction chamber (1) there are a substrate carrier (4), a substrate (3) and a filament (5)

The metallic substrates which may be used within the scope of the invention are substrates withstanding a temperature of at least 600° C. For example, the substrate is a substrate made of steel, alloy, doped or undoped silicon, titanium or titanium oxide, hafnium, molybdenum, tungsten, copper, cobalt, chromium, nickel, tantalum, zirconium or niobium; or an oxide of these metals.

According to a preferred embodiment, the metallic substrate is made of titanium or titanium alloy. Such a substrate is conductive and may be easily shaped.

The multilayer system of the invention may be obtained by a method which consists of (1) depositing on a metallic substrate an intermediate layer comprising at least one metallocene, (2) thermally decomposing this intermediate layer at a temperature greater than the decomposition temperature of the metallocene compound, and (3) forming a diamond layer by chemical vapour deposition.

According to the present invention, the diamond layer may be deposited during and/or after thermal decomposition of the metallocene.

Within the scope of the invention, the metallocene compound is generally decomposed at a temperature greater than 500° C.

When titanocenes are used, this temperature is equal to at least 700° C, preferably between 700° and 1000° C.

Metallocenes, in particular titanocenes, are materials which are reactive on contact with air, which makes them difficult to handle. Within the scope of the present invention, this disadvantage may be remedied by dispersing the metallocene in a solid inert medium formed from an organic polymer inert as regards the metallocene, for example a paraffin such as Nujol®. This dispersion of metallocene in paraffin is implemented without any difficulty on the metallic substrate.

Moreover, the paraffin contributes advantageously to the formation of the diamond by acting as a supplementary source of carbon.

Other techniques may be used to deposit the metallocene on the metallic substrate, for example vapour deposition, sublimation or vacuum deposition.

The diamond layers of the system of the present invention may be obtained by any vapour deposition technique such as for example the hot filament CVD (HFCVD) technique, the plasma assisted CVD (PECVD) technique, or the electron assisted CVD (EACVD) technique.

These layers are generally obtained from a gaseous mixture composed of a carrier gas, at least one source of carbon and possibly a doping agent.

The carrier gas, which may be reactive and/or simply a carrier, constitutes the majority gas of the mixture. This carrier gas is generally hydrogen, which is essential for the formation of the diamond. Besides the hydrogen, the carrier gas may also contain a rare gas such as argon, helium or xenon. In certain cases, it may be advantageous to introduce a small quantity of oxygen into the reaction chamber.

The carbon source is composed of one or more hydrocarbons such as methane, propane, butane, acetylene, unsaturated hydrocarbons, alcohols, ketones, etc. Commonly methane is used.

The carrier gas and the carbon source may be introduced into the reaction chamber as a mixture or separately.

According to one embodiment, 0.5 to 10% (vol.) of the gaseous mixture inside the reaction chamber is the carbon source, preferably methane, with possibly a quantity of doping agent less than or equal to 1% (vol.), the remainder to 100% being represented by the carrier gas, preferably hydrogen.

Within the scope of the present invention, the diamond layers may be doped by means of the dopants cited for example in U.S. Pat. No. 5,162,886. The dopants which may be used are for example, boron, lithium, beryllium, nitrogen, phosphorus, sulphur, chlorine, arsenic and selenium.

The most common doped diamond is diamond doped with boron, which may be obtained with a doping agent selected from the amino-boranes, $BH_3$, $B_2H_6$, $B_2O_3$.

The amino-boranes are for example selected from the following compounds: $(CH_3)_3N.BH_3$, $(C_2H_5)_3N.BH_3$, $(CH_3)_2NH.BH_3$, $[(CH_3)_2CH]_2NC_2H_5.BH_3$, $(CH_3)_3CNH_2.BH_3$, $C_6H_5N(C_2H_5)_2.BH_3$, and $(C_5H_5)_3N.BH_3$.

When amino-boranes having a low vapour pressure are used, it may be useful to use an activating agent such as ammonia. Preferably, the quantity of this activating agent in the reaction chamber (1) is between 0.01 and 1% (vol.).

When the multilayer system of the present invention includes a doped diamond layer, that is to say a conductive one, on a conductive metallic substrate, it may be used advantageously to produce diamond electrodes. In this case, the thermal decomposition of the metallocene compound must be effected under non-oxidizing conditions in order to avoid the formation of metallic oxide which would reduce the conductivity of the doped diamond layer.

According to the present invention, the thermal decomposition of the metallocene compound under non-oxidizing conditions is effected under inert gas, for example argon or nitrogen, or in a reducing atmosphere, for example hydrogen.

The electrodes obtained with the system of the present invention exhibit a great improvement in adhesion between the substrate and the diamond layer.

In this mode of use of the multilayer system of the invention, the thickness of the system is between 3 $\mu$m and 1 mm, preferably between 10 and 100 $\mu$m, and its electrical resistance is preferably less than 100 $\Omega$, and preferably less than 10 $\Omega$.

These diamond electrodes are particularly effective for the electro-oxidation of seasoned photographic baths which may contain phenols, hydroquinone or one of its derivatives, glycol, a phenylenediamine, a phenidone, an aminoalcohol, an hydroxymethylbenzene, a carboxylic acid, a chelating agent such as a phosphate, an aminocarboxylic acid, an hydroxycarboxylic acid, etc.

Because of their high chemical stability, the boron-doped diamond layers of the invention may also be used in electronics or optoelectronics, for example for the manufacture of diodes.

EXAMPLES

In the following examples, the diamond layer of the multilayer system of the present invention was obtained by hot filament CVD. Typically, the device for implementing this technique described in FIG. 1 comprises a stainless steel vacuum chamber (1). Provision is made for means (not shown) to cool the vacuum chamber (1), this vacuum chamber being evacuated by means of a two-stage pump (2). The substrate to be coated (3) is placed on a substrate carrier (4) in the vicinity of which is disposed a tungsten or tantalum filament (5) brought to a temperature of around 2000° C., the function of which is to split the gas molecules into elements which can then be deposited. The filament is fixed between two copper electrodes. The current intensity is kept constant and depends on the length and nature of the filament. Generally, the distance between the filament and the substrate is of the order of 10 mm. A gaseous mixture containing hydrogen, methane and possibly the doping agent and ammonia is used. The filament and the substrate are first heated to temperatures below the deposition temperature, which is of the order of 800° C. in a hydrogen atmosphere (with a pressure of around 60 mbar). The methane is then introduced into the reaction chamber. The doping agent may be introduced into the reaction chamber at the same time or delayed with respect to the $H_2/CH_4$ gaseous mixture.

An optional vaporisation device 6 may be used when a doping agent in solid form is used. The device 6 may be a simple thermostatically-controlled enclosure or a sublimator.

Example 1

0.3 g of $(\eta^5-C_5H_5)_2TiCl_2$ made by Strem® is dispersed in 1 g of anhydrous paraffin oil. In this way a solid paste is formed. The paraffin oil acts as a protective hydrophobic binder which allows the mixture to be kept in the open air.

A titanium substrate is then coated with this paste. The substrate coated in this way is placed in the reaction chamber (1) of the hot filament CVD device of FIG. 1, in a reducing atmosphere.

The substrate is heated at 700° C. for several minutes (15 minutes to 1 hour) at reduced pressure in order to thermally decompose the titanocene.

Hydrogen and methane are then introduced into the reaction chamber under the operating conditions described above for 6 hours in order to obtain a gaseous mixture composed mainly of hydrogen and around 2% methane in the reaction chamber. In this way a diamond layer is formed on the interphase, composed of the product of decomposition of the titanocene.

A diamond layer was thus obtained which adheres strongly to the titanium substrate.

The Raman spectrum (FIG. 2) and the electron micrograph (FIG. 3) of the diamond layer of the multilayer system of the invention reveals the crystalline structure of the diamond, which proves that the presence of the intermediate layer of the invention does not inhibit the formation of the diamond.

Example 2

The procedure of Example 1 is repeated except that a doping agent, trimethylamino-borane, which is placed in the enclosure (6) kept at ambient temperature, is introduced into the reaction chamber during the formation of the diamond layer. The amino-borane vapours pass into the reaction chamber naturally.

Hydrogen and methane are introduced into the reaction chamber for 6 hours, under the operating conditions described above, in order to obtain a gaseous mixture in the reaction chamber composed mainly of hydrogen, around 2% methane and trimethylamino-borane (a quantity less than or equal to 1%).

In this way a conductive boron-doped diamond layer was obtained which adheres strongly to the titanium substrate.

Figure 2:
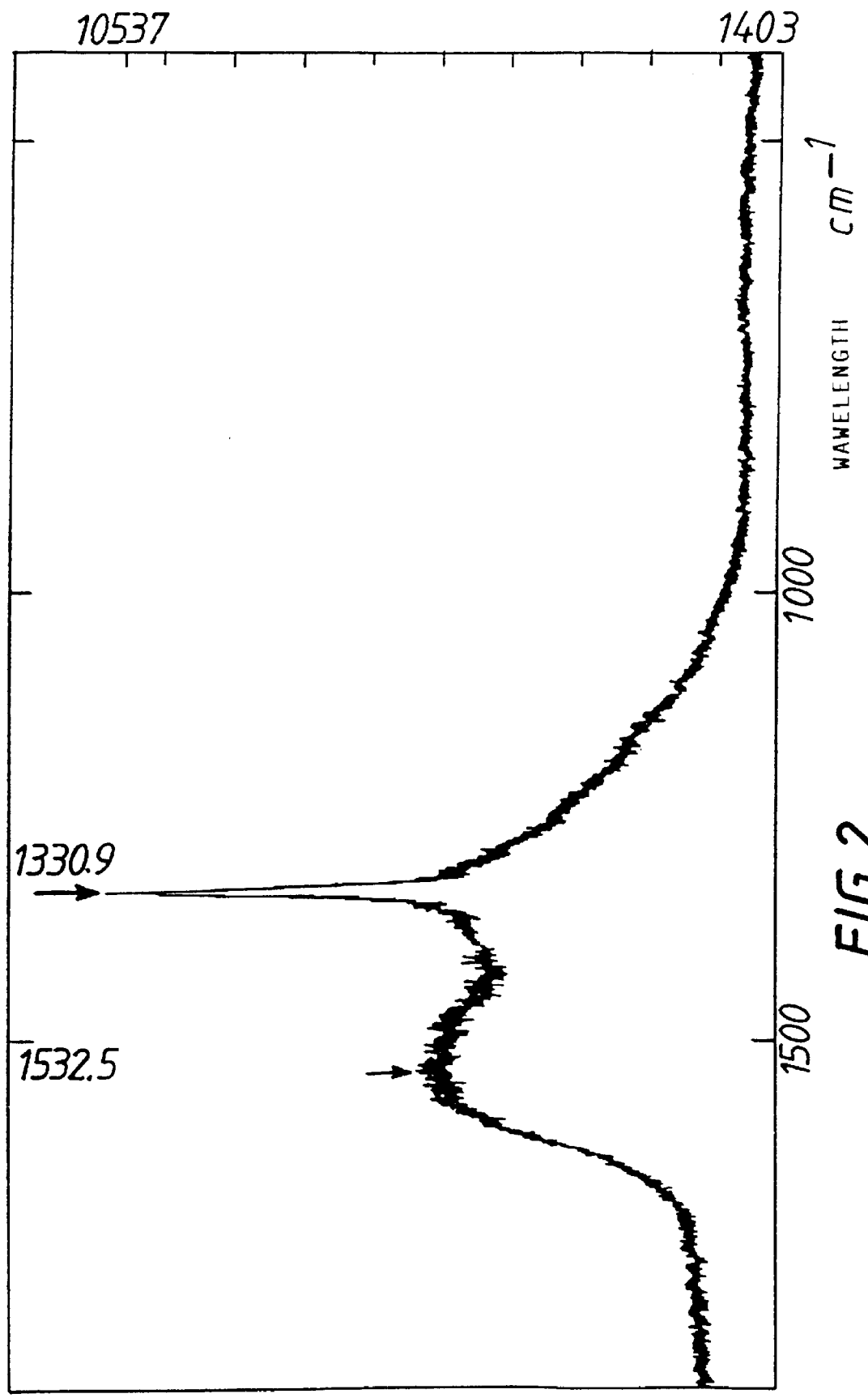
FIG. 2 is a Raman spectrum of the diamond layers obtained according to the present invention.
Figure 3:
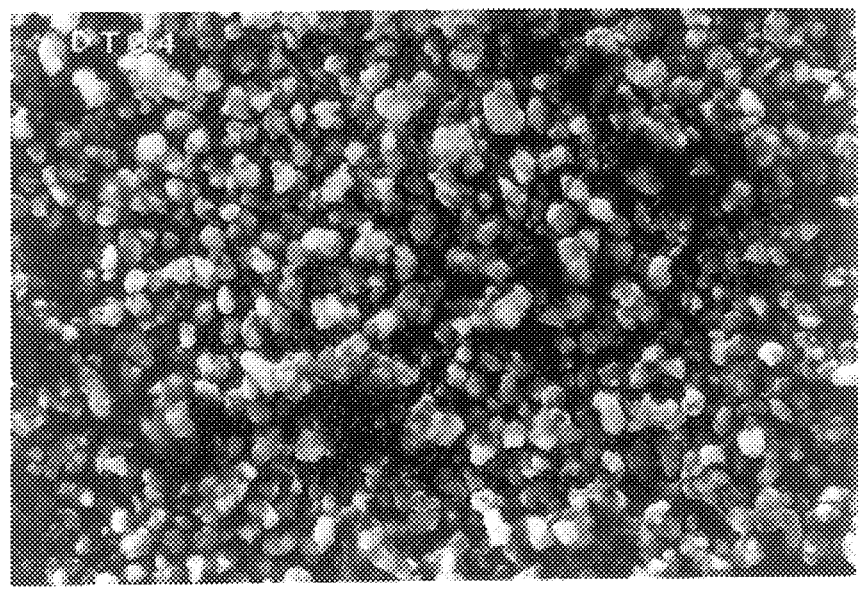
FIG. 3 is an electron micrograph of the crystalline structure of the diamond obtained.

The Raman spectrum of the diamond layer obtained is identical to that of FIG. 2.

Example 3

A diamond layer was made to grow on a titanium substrate under the same operating conditions as Example 1 in the absence of the interphase of the invention.

In this way, a diamond layer which does not exhibit any measurable adhesion was obtained.

The use of such a multilayer system as an electrode is not conceivable because of the lack of adhesion between the metallic substrate and the diamond layer.

Example 4

The system of Example 2 on a titanium substrate (Invention) was used as an electrode to carry out the electro-oxidation of a solution containing phenol (60 ml of solution containing 1000 ppm phenol) and $Na_2SO_4$, 0.5M, which simulates a seasoned developing bath, with a current density of 100 mA/cm$^2$.

The electrode of the present invention was used for 9 hours.

Figure 4:
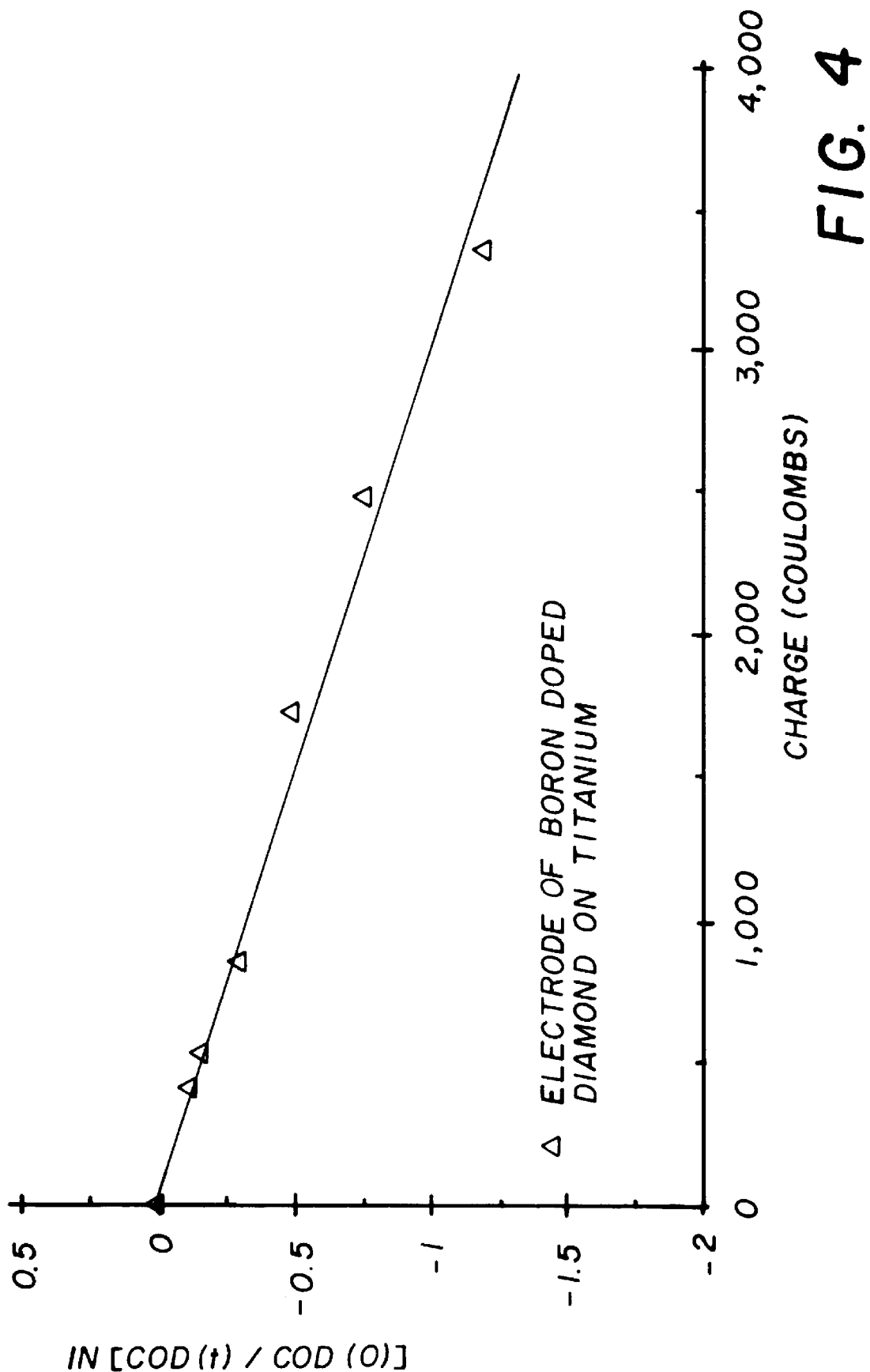
FIG. 4 shows the use of the system of the present invention as an electrode.

The performance of the electrode is assessed through the reduction in the chemical oxygen demand (COD) as a function of the quantity of electricity used (see FIG. 4).

The experimental results show that the oxygen demand was reduced by 70% (initial value: 2320 mg–final value: 710 mg).

We claim:

1. Multilayer system comprising a metallic substrate, an interphase and a diamond layer, the interphase being composed of the product of thermal decomposition of at least one metallocene compound in a solid inert organic medium, the metallocene having the formula $R_nMX_m$ in which X is a halogen atom, M is a metal selected from titanium, cobalt, nickel and iron, R is a cyclopentadienyl radical substituted or unsubstituted, and n and m are such that n is equal to at least 1 and the sum n+m is equal to the valency of the metal.

2. Multilayer system according to claim 1, in which the cyclopentadienyl radical or radicals are substituted in one or more positions by a linear or branched alkyl group of 1 to 5 carbon atoms.

3. Multilayer system according to claim 1, in which the metallocene is a titanocene of formula:

$$(\eta^5-C_5H_5)_nTiX_m$$

in which X is Cl or Br, n and m are such that n is equal to at least 1 and the sum of n+m is equal to 4.

4. Multilayer system according to claim 3, in which the titanocene is $(\eta^5-C_5H_5)_2TiCl_2$.

5. Multilayer system according to claim 1, in which the metallic substrate is composed of titanium or a titanium alloy.

6. Multilayer system according to any one of claims 1 to 5, in which the interphase is composed of the product of decomposition of the metallocene under non-oxidizing conditions.

7. Multilayer system according to claim 6, in which the substrate is conductive and the diamond is doped.

8. Multilayer system according to claim 7, in which the substrate is made of titanium or titanium alloy and the diamond is doped with boron.

9. Method of manufacture of a multilayer system comprising a substrate, an interphase and a diamond layer obtained by chemical vapour deposition using a gaseous mixture comprising at least one source of carbon and a carrier gas, the method being characterized in that (1) an intermediate layer comprising at least one metallocene compound in a solid inert organic medium is deposited on the metallic substrate, (2) the metallocene of this intermediate layer is thermally decomposed at a temperature greater than the decomposition temperature of the metallocene, and (3) a diamond layer is formed by CVD.

10. Method according to claim 9, in which the formation of the diamond is effected during and/or after thermal decomposition of the metallocene.

11. Method according to claim 9, in which the metallocene is deposited on the metallic substrate by chemical vapour deposition, sublimation or vacuum deposition.

12. Method according to claim 9, in which the metallocene is deposited on the metallic substrate as a mixture in an inert binder.

13. Method according to claim 9, in which the metallocene is a titanocene of formula:

$$(\eta^5-C_5H_5)_nTiX_m$$

in which X is Cl or Br, n and m are such that n is equal to at least 1 and the sum of n+m is equal to 4, preferably $(\eta^5-C_5H_5)_2TiCl_2$.

14. Method according to any one of claims 9 to 14, in which the metallocene is thermally decomposed under non-oxidizing conditions.

15. Method according to claim 14, in which the diamond layer is formed in the presence of a doping agent and the substrate is conductive.

16. Multilayer system according to claim 7 for electro-oxidation of seasoned photographic baths.

17. Method according to claim 15 for manufacturing a diamond electrode.

* * * * *